(12) United States Patent
Miyata

(10) Patent No.: US 11,569,636 B2
(45) Date of Patent: Jan. 31, 2023

(54) LIGHT EMITTING DEVICE AND PROJECTOR

(71) Applicant: Seiko Epson Corporation, Tokyo (JP)

(72) Inventor: Takashi Miyata, Shiojiri (JP)

(73) Assignee: SEIKO EPSON CORPORATION

( * ) Notice: Subject to any disclaimer, the term of this patent is extended or adjusted under 35 U.S.C. 154(b) by 284 days.

(21) Appl. No.: 16/912,781

(22) Filed: Jun. 26, 2020

(65) Prior Publication Data
US 2020/0412099 A1 Dec. 31, 2020

(30) Foreign Application Priority Data

Jun. 28, 2019 (JP) .............................. JP2019-121002

(51) Int. Cl.
| | | |
|---|---|---|
| H01S 5/34 | (2006.01) | |
| G03B 21/20 | (2006.01) | |
| H01S 5/343 | (2006.01) | |
| H01S 5/042 | (2006.01) | |
| H01S 5/183 | (2006.01) | |
| G03B 33/12 | (2006.01) | |

(52) U.S. Cl.
CPC .......... *H01S 5/341* (2013.01); *G03B 21/2033* (2013.01); *H01S 5/04254* (2019.08); *H01S 5/18319* (2013.01); *H01S 5/34333* (2013.01); G03B 33/12 (2013.01)

(58) Field of Classification Search
CPC .. H01S 5/341; H01S 5/04254; H01S 5/18319; G03B 21/2033
See application file for complete search history.

(56) References Cited

U.S. PATENT DOCUMENTS

| | | | |
|---|---|---|---|
| 2004/0157354 A1* | 8/2004 | Kuriyama | ............. H01L 31/105 438/45 |
| 2004/0253758 A1 | 12/2004 | Jung et al. | |
| 2015/0325743 A1* | 11/2015 | Mi | ................... H01L 21/02573 257/13 |
| 2015/0346522 A1 | 12/2015 | Hilarius et al. | |

FOREIGN PATENT DOCUMENTS

| | | |
|---|---|---|
| JP | 2005-005266 A | 1/2005 |
| JP | 2005-123501 A | 5/2005 |
| JP | 2009-142474 A | 7/2009 |
| JP | 2009-152474 A | 7/2009 |
| JP | 2010-098136 A | 4/2010 |
| JP | 2012-060188 A | 3/2012 |
| JP | 2015-522837 A | 8/2015 |
| JP | 2019-029516 A | 2/2019 |

* cited by examiner

*Primary Examiner* — Yuanda Zhang
(74) *Attorney, Agent, or Firm* — Harness, Dickey & Pierce, P.L.C.

(57) ABSTRACT

A light emitting device includes a substrate, a laminated structure provided to the substrate, and including a plurality of columnar parts, and an electrode disposed at an opposite side to the substrate of the laminated structure, wherein the columnar parts have a light emitting layer, the columnar parts are disposed between the electrode and the substrate, light generated in the light emitting layer propagates through the plurality of columnar parts to cause laser oscillation, and the electrode is provided with a hole.

5 Claims, 4 Drawing Sheets

LIGHT EMITTING DEVICE AND PROJECTOR

The present application is based on, and claims priority from JP Application Serial Number 2019-121002, filed Jun. 28, 2019, the disclosure of which is hereby incorporated by reference herein in its entirety.

BACKGROUND

1. Technical Field

The present disclosure relates to a light emitting device and a projector.

2. Related Art

Semiconductor lasers are promising as high-luminance next-generation light sources. In particular, the semiconductor laser having a nano-structure called a nano-column, a nano-wire, a nano-rod, a nano-pillar, or the like is expected to realize a light emitting device capable of obtaining narrow radiation angle and high power light emission due to an effect of a photonic crystal.

In JP-A-2009-142474, there is disclosed a light emitting element in which an insulating film is formed on a side surface of a nano-column, and then an transparent electrode is formed by evaporation in a light emitting element having a GaN nano-column formed by stacking an n-type GaN layer, a light emitting layer, and a p-type GaN layer.

In the light emitting element having the nano-column, the electrode is disposed on the nano-column as described above, and therefore, the light is absorbed by the electrode. For example, in the semiconductor laser having the nano-column, due to the absorption of the light by the electrode, the oscillation threshold value rises.

SUMMARY

A light emitting device according to an aspect of the present disclosure includes a substrate, a laminated structure provided to the substrate, and including a plurality of columnar parts, and an electrode disposed at an opposite side to the substrate of the laminated structure, wherein the columnar parts have a light emitting layer, the columnar parts are disposed between the electrode and the substrate, light generated in the light emitting layer propagates through the plurality of columnar parts to cause laser oscillation, and the electrode is provided with a hole.

In the light emitting device according to the above aspect, the hole may penetrate the electrode.

In the light emitting device according to the above aspect, a diametrical size of the hole may be smaller than a diametrical size of the columnar part.

In the light emitting device according to the above aspect, at least a part of the hole may fail to overlap the columnar parts in a plan view viewed from a stacking direction of the laminated structure.

In the light emitting device according to the above aspect, a plurality of the holes may be provided, and a distance between the holes adjacent to each other may be longer than a wavelength of light generated by the light emitting layer.

In the light emitting device according to the above aspect, the hole may have a longitudinal direction and a short-side direction in a plan view viewed from a stacking direction of the laminated structure, and a length in the short-side direction of the hole may be shorter than a diametrical size of the columnar part.

A projector according to another aspect of the present disclosure includes the light emitting device according to one of the above aspects.

DESCRIPTION OF EXEMPLARY EMBODIMENTS

Some preferred embodiments of the present disclosure will hereinafter be described in detail using the drawings. It should be noted that the embodiments described hereinafter do not unreasonably limit the contents of the present disclosure as set forth in the appended claims. Further, all of the constituents described hereinafter are not necessarily essential elements of the present disclosure.

1. First Embodiment

1.1. Light Emitting Device

Figure 1:
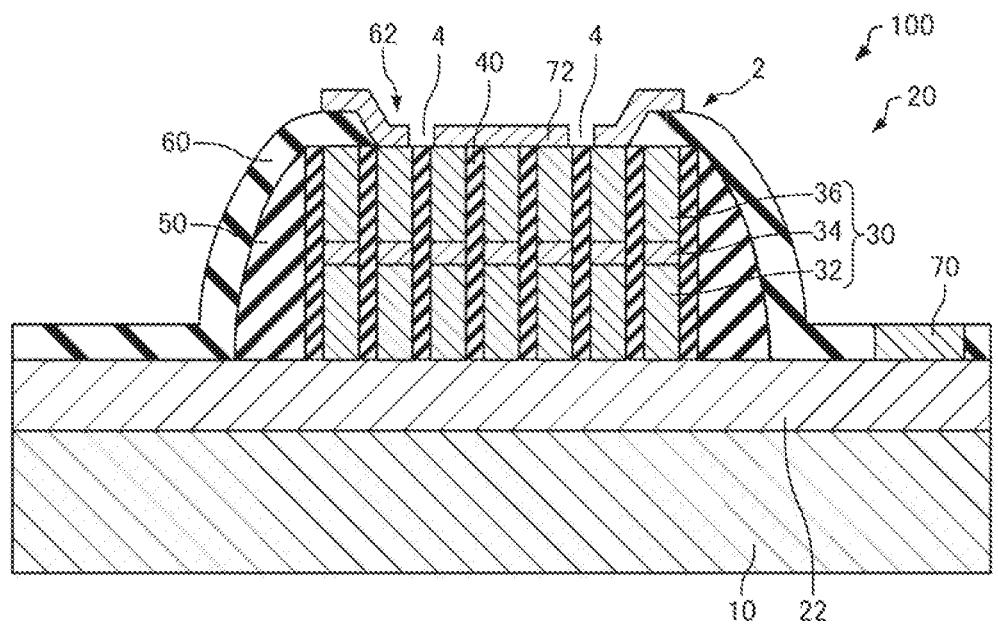
FIG. 1 is a cross-sectional view schematically showing a light emitting device according to a first embodiment.
Figure 2:
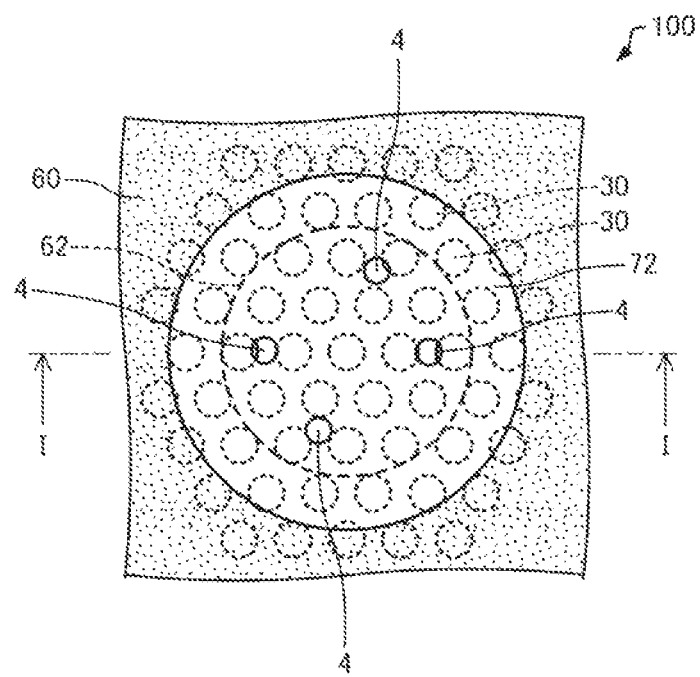
FIG. 2 is a plan view schematically showing the light emitting device according to the first embodiment.

Firstly, a light emitting device according to a first embodiment will be described with reference to the drawings. FIG. 1 is a cross-sectional view schematically showing a light emitting device 100 according to the first embodiment. FIG. 2 is a plan view schematically showing the light emitting device 100 according to the first embodiment. It should be noted that FIG. 1 is a cross-sectional view along the line I-I shown in FIG. 2.

As shown in FIG. 1 and FIG. 2, the light emitting device 100 has a substrate 10, a laminated structure 20, a sidewall 50, an insulating layer 60, a first electrode 70, and a second electrode 72.

The substrate 10 has, for example, a plate-like shape. The substrate 10 is, for example, an Si substrate, a GaN substrate, a sapphire substrate, or a glass substrate.

The laminated structure 20 is provided to the substrate 10. The laminated structure 20 is disposed on the substrate 10. The laminated structure 20 has, for example, a buffer layer 22, columnar parts 30, and a light propagation layer 40.

It should be noted that in the present specification, when taking a light emitting layer 34 as a reference in the stacking direction of the laminated structure 20 (hereinafter also referred to simply as a "stacking direction"), the description will be presented assuming a direction from the light emitting layer 34 toward the second semiconductor layer 36 as an "upward direction," and a direction from the light emitting layer 34 toward a first semiconductor layer 32 as a "downward direction." Further, the "stacking direction of the laminated structure" denotes a stacking direction of the first semiconductor layer 32 and the light emitting layer 34.

The buffer layer 22 is disposed on the substrate 10. The buffer layer 22 is, for example, an Si-doped n-type GaN layer.

The columnar parts 30 are disposed on the buffer layer 22. The columnar parts 30 are disposed between the substrate 10 and the second electrode 72. The columnar parts 30 each have a columnar shape protruding upward from the buffer layer 22. The planar shape of the columnar part 30 is, for example, a polygonal shape or a circle. In the example shown in FIG. 2, the planar shape of the columnar part 30 is a circle. The diametrical size of the columnar part 30 is in a nanometer-order range, and is, for example, no smaller than 10 nm and no larger than 500 nm. The columnar part 30 is also referred to as, for example, a nano-column, a nano-wire, a nano-rod, or a nano-pillar.

It should be noted that when the planar shape of the columnar part 30 is a circle, the "diametrical size of the columnar part" denotes the diameter of the circle, and when the planar shape of the columnar part 30 is not a circular shape, the "diametrical size of the columnar part" denotes the diameter of the minimum enclosing circle. For example, when the planar shape of the columnar part 30 is a polygonal shape, the diametrical size of the columnar part is the diameter of the minimum circle including the polygonal shape inside, and when the planar shape of the columnar part 30 is an ellipse, the diametrical size of the columnar part 30 is the diameter of the minimum circle including the ellipse inside. When the planar shape of the columnar part 30 is a circle, the "center of the columnar part 30" denotes the center of the circle, and when the planar shape of the columnar part 30 is not a circular shape, the "center of the columnar part 30" denotes the center of the minimum enclosing circle. For example, when the planar shape of the columnar part 30 is a polygonal shape, the center of the columnar part 30 is the center of the minimum circle including the polygonal shape inside, and when the planar shape of the columnar part 30 is an ellipse, the center of the columnar part 30 is the center of the minimum circle including the ellipse inside.

The number of the columnar parts 30 disposed is more than one. An interval between the columnar parts 30 adjacent to each other is, for example, no smaller than 1 nm and no larger than 500 nm. The plurality of columnar parts 30 is arranged at a predetermined pitch in a predetermined direction in a plan view viewed from the stacking direction (hereinafter also referred simply to "in the plan view"). The plurality of columnar parts 30 is disposed so as to form, for example, a triangular grid or a quadrangular grid. The plurality of columnar parts 30 can develop an effect of a photonic crystal. The columnar parts 30 each have the first semiconductor layer 32, the light emitting layer 34, and a second semiconductor layer 36. The pitch of the columnar parts 30 is a distance between the centers of the columnar parts 30 adjacent to each other along the predetermined direction.

The first semiconductor layer 32 is disposed on the buffer layer 22. The first semiconductor layer 32 is disposed between the substrate 10 and the light emitting layer 34. The first semiconductor layer 32 is an n-type semiconductor layer. The first semiconductor layer 32 is, for example, an Si-doped n-type GaN layer.

The light emitting layer 34 is disposed on the first semiconductor layer 32. The light emitting layer 34 is disposed between the first semiconductor layer 32 and the second semiconductor layers 36. The light emitting layer 34 emits light in response to injection of an electrical current. The light emitting layer 34 has a multiple quantum well structure obtained by stacking quantum well structures each constituted by, for example, an i-type GaN layer doped with no impurity and an i-type InGaN layer.

The second semiconductor layer 36 is disposed on the light emitting layer 34. The second semiconductor layer 36 is a layer different in conductivity type from the first semiconductor layer 32. The second semiconductor layer 36 is a p-type semiconductor layer. The second semiconductor layer 36 is, for example, an Mg-doped p-type GaN layer. The first semiconductor layer 32 and the second semiconductor layer 36 are cladding layers having a function of confining the light in the light emitting layer 34.

The light propagation layer 40 is disposed between the columnar parts 30 adjacent to each other. The light propagation layer 40 is disposed on the buffer layer 22. The light propagation layer 40 surrounds the columnar parts in the plan view. The refractive index of the light propagation layer 40 is lower than, for example, the refractive index of the light emitting layer 34. The light propagation layer 40 is, for example, a silicon oxide layer, an aluminum oxide layer, or a titanium oxide layer. The light generated in the light emitting layer 34 can pass through the light propagation layer 40 to propagate in a direction perpendicular to the stacking direction. It should be noted that an air gap can be disposed between the columnar parts 30 adjacent to each other although not shown in the drawings.

The sidewall 50 is disposed so as to surround an area where the plurality of columnar parts 30 and the light propagation layer 40 are formed. The sidewall 50 is disposed on, for example, a side wall of the columnar part 30 or a side wall of the light propagation layer 40. In the illustrated example, the sidewall 50 is disposed on the side wall of the light propagation layer 40. The sidewall 50 is formed of an insulating member such as silicon oxide or silicon nitride.

The insulating layer 60 is disposed on the laminated structure 20. The insulating layer 60 is disposed on the buffer layer 22, the sidewall 50, the light propagation layer 40, and the plurality of columnar parts 30. The insulating layer 60 covers the plurality of columnar parts 30, the light propagation layer 40, and the sidewall 50. The insulating layer 60 has an opening part 62. The opening part 62 overlaps the plurality of columnar parts 30 and the light propagation layer 40 in the plan view. In the opening part 62, there is disposed the second electrode 72. The insulating layer 60 is, for example, an organic film made of polyimide or the like, or a silicon oxide layer.

The first electrode 70 is disposed on the buffer layer 22. It is also possible for the buffer layer 22 to have ohmic contact with the first electrode 70. The first electrode 70 is electrically coupled to the first semiconductor layer 32. In the illustrated example, the first electrode 70 is electrically coupled to the first semiconductor layer 32 via the buffer layer 22. The first electrode 70 is one of the electrodes for injecting the electrical current into the light emitting layer 34. As the first electrode 70, there is used, for example, what is obtained by stacking a Ti layer, an Al layer, and an Au layer in this order from the buffer layer 22 side.

The second electrode 72 is disposed at the opposite side to the substrate 10 of the laminated structure 20. The second electrode 72 is disposed in the opening part 62 of the insulating layer 60. The second electrode 72 is disposed so as to close the opening part 62 of the insulating layer 60. In the illustrated example, the second electrode 72 is disposed on the insulating layer 60, and the second semiconductor layer 36 and the light propagation layer 40 both exposed by the opening part 62. The planar shape of the second electrode 72 is a circle in the illustrated example. It is also possible for the second semiconductor layer 36 to have ohmic contact with the second electrode 72. The second electrode 72 is electrically coupled to the second semiconductor layer 36. The second electrode 72 is the other of the electrodes for injecting the electrical current into the light emitting layer 34. As the second electrode 72, there is used a transparent electrode made of, for example, ITO (indium tin oxide). As the second electrode 72, there can be used a metal thin film formed so thin that the light can be transmitted. The light emitting device 100 can be provided with an interconnection layer electrically coupled to the second electrode 72, and it is possible for the second electrode 72 to be supplied with the electrical current through the interconnection layer.

It should be noted that although not shown in the drawings, a contact layer can also be disposed between the second semiconductor layer 36 and the second electrode 72. It is also possible for the contact layer to have ohmic contact with the second electrode 72. The contact layer is, for example, a p-type GaN layer. The contact layer can be provided to each of the columnar parts 30 to constitute the columnar part 30, or can also be a single layer straddling the plurality of columnar parts 30.

The second electrode 72 and the insulating layer 60 constitute a covering part 2 for covering the laminated structure 20. In the illustrated example, the covering part 2 covers the columnar parts 30, the light propagation layer 40, the sidewall 50, and the buffer layer 22. The insulating layer 60 covers the buffer layer 22, the sidewall 50, and the columnar parts 30 and the light propagation layer 40 both not overlapping the opening part 62 in the plan view. The second electrode 72 covers the columnar parts 30 and the light propagation layer 40 both overlapping the opening part in the plan view. As described above, the laminated structure 20 and the sidewall 50 are covered with the second electrode 72 and the insulating layer 60. In the illustrated example, the columnar parts 30, the light propagation layer 40, and the sidewall 50 are housed in a space formed by the covering part 2.

The second electrode 72 is provided with holes 4. The holes 4 are each a through hole penetrating the second electrode 72. The holes 4 are each a hollow. The second electrode 72 is provided with the plurality of holes 4. In the example shown in FIG. 2, the second electrode 72 is provided with the four holes 4. It should be noted that the number and the positions of the holes 4 are not particularly limited.

For example, the holes 4 are not arranged at regular intervals. Thus, it is possible to reduce the possibility that the diffraction or the effect of the photonic crystal develops due to the holes 4. Further, for example, the distance between the holes 4 adjacent to each other is longer than the wavelength of the light generated in the light emitting layer 34. Here, the holes 4 adjacent to each other means the hole 4 as the target, and the hole 4 the shortest in distance from the target hole 4. Since the distance between the holes 4 adjacent to each other is longer than the wavelength of the light generated in the light emitting layer 34, it is possible to reduce the possibility that the diffraction or the effect of the photonic crystal develops due to the holes 4. For example, when the holes 4 are arranged at regular intervals with a pitch equal to or shorter than the wavelength of the light generated in the light emitting layer 34, there is a possibility that the diffraction or the effect of the photonic crystal develops due to the holes 4. The pitch of the holes 4 is a distance between the centers of the holes 4 adjacent to each other.

A part of each of the holes 4 does not overlap the columnar part 30 in the plan view. In other words, the hole 4 has a part not overlapping the columnar part 30 and a part overlapping the columnar part 30 in the plan view. In the illustrated example, the hole 4 overlaps the columnar part 30 and the light propagating layer 40 in the plan view. A part of the columnar part 30 and a part of the light propagation layer 40 are exposed by the hole 4.

It should be noted that all of the holes 4 are not necessarily required to overlap the columnar part 30 in the plan view. In other words, it is possible for the hole 4 not to have a part overlapping the columnar part 30, but to overlap only the light propagation layer 40.

The cross-sectional shape of the hole 4 is, for example, a circle. The cross-sectional shape of the hole 4 is not limited to a circle, but can also be a polygonal shape, an ellipse, or the like. The diametrical size of the hole 4 is smaller than the diametrical size of the columnar part 30. The diametrical size of the hole 4 is, for example, no larger than 100 nm.

It should be noted that when the cross-sectional shape of the hole 4 is a circle, the "diametrical size of the hole" denotes the diameter of the circle, and when the cross-sectional shape of the hole 4 is not a circular shape, the "diametrical size of the hole" denotes the diameter of the minimum enclosing circle. For example, when the cross-sectional shape of the hole 4 is a polygonal shape, the diametrical size of the hole 4 is the diameter of the minimum circle including the polygonal shape inside, and when the cross-sectional shape of the hole 4 is an ellipse, the diametrical size of the hole 4 is the diameter of the minimum circle including the ellipse inside. When the planar shape of the hole 4 is a circle, the "center of the hole" denotes the center of the circle, and when the planar shape of the hole 4 is not a circular shape, the "center of the hole" denotes the center of the minimum enclosing circle. For example, when the planar shape of the hole 4 is a polygonal shape, the center of the hole 4 is the center of the minimum circle including the polygonal shape inside, and when the planar shape of the hole 4 is an ellipse, the center of the hole 4 is the center of the minimum circle including the ellipse inside.

In the light emitting device 100, a pin diode is constituted by the p-type second semiconductor layer 36, the light emitting layer 34, and the n-type first semiconductor layer 32. In the light emitting device 100, when applying a forward bias voltage of the pin diode between the first electrode 70 and the second electrode 72, the electrical current is injected into the light emitting layer 34, and recombination of electrons and holes occurs in the light emitting layer 34. The recombination causes light emission. The light generated in the light emitting layer 34 propagates through the plurality of columnar parts 30 passing through the light propagation layer 40 in a direction perpendicular to the stacking direction due to the first semiconductor layer 32 and the second semiconductor layer 36. The light propagating through the plurality of columnar parts 30 forms a standing wave due to the effect of the photonic crystal caused by the plurality of columnar parts 30, and then causes laser oscillation with a gain in the light emitting layer 34. Then, the light emitting device 100 emits positive first-order diffracted light and negative first-order diffracted light as a laser beam in the stacking direction.

It should be noted that although there is described above when the light emitting device 100 is a light emitting device in which a single columnar part aggregate formed of the plurality of columnar parts 30 is disposed on the substrate 10, the light emitting device 100 can also be a light emitting device in which the columnar part aggregate is used as a single pixel, and the plurality of columnar part aggregates are arranged on the substrate 10 as an array to form a plurality of pixels.

Further, although not shown in the drawings, it is also possible to dispose a reflecting layer between the substrate 10 and the buffer layer 22, or below the substrate 10. The reflecting layer is, for example, a DBR (Distributed Bragg Reflector) layer. Due to the reflecting layer, it is possible to reflect the light generated in the light emitting layer 34, and thus, it is possible for the light emitting device 100 to emit the light only from the second electrode 72 side.

The light emitting device 100 has, for example, the following advantages.

In the light emitting device 100, the light generated in the light emitting layer 34 propagates through the plurality of columnar parts 30 to cause the laser oscillation, and the second electrode 72 is provided with the holes 4. The light propagating through the plurality of columnar parts 30 is absorbed by the second electrode 72 to cause a light loss. Due to the light loss, the oscillation threshold value rises. In the light emitting device 100, since the second electrode 72 is provided with the holes 4 which do not absorb the light, the light absorption can be reduced accordingly to the holes 4. Therefore, in the light emitting device 100, the oscillation threshold value can be decreased.

In the light emitting device 100, the through holes 4 penetrate the second electrode 72. Therefore, compared to when, for example, the holes 4 do not penetrate the second electrode 72, the light absorption by the second electrode 72 can be reduced.

In the light emitting device 100, the diametrical size of the hole 4 is smaller than the diametrical size of the columnar part 30. Therefore, in the light emitting device 100, the holes 4 do not hinder the electrical coupling between the second electrode 72 and the columnar parts 30. For example, when the diametrical size of the hole 4 is no smaller than the diametrical size of the columnar part 30, the second electrode 72 and the columnar part 30 fail to electrically be coupled to each other in some cases depending on the position of the hole 4. In contrast, when the diametrical size of the hole 4 is smaller than the diametrical size of the columnar part 30, it is possible to surely couple the second electrode 72 and the columnar part 30 electrically to each other irrespective of the position of the hole 4.

In the light emitting device 100, at least a part of the hole 4 fails to overlap the columnar part 30 in the plan view. Therefore, it is possible to increase the contact area between the second electrode 72 and the columnar part 30 compared to when, for example, the whole of the hole 4 overlaps the columnar part 30. Therefore, for example, it is possible to reduce the electrical resistance between the second electrode 72 and the columnar part 30.

In the light emitting device 100, the distance between the holes 4 adjacent to each other is longer than the wavelength of the light generated in the light emitting layer 34. Therefore, in the light emitting device 100, it is possible to reduce the possibility that the diffraction or the effect of the photonic crystal develops due to the holes 4.

1.2. Method of Manufacturing Light Emitting Device

Then, a method of manufacturing the light emitting device 100 will be described with reference to the drawings.

Figure 3:
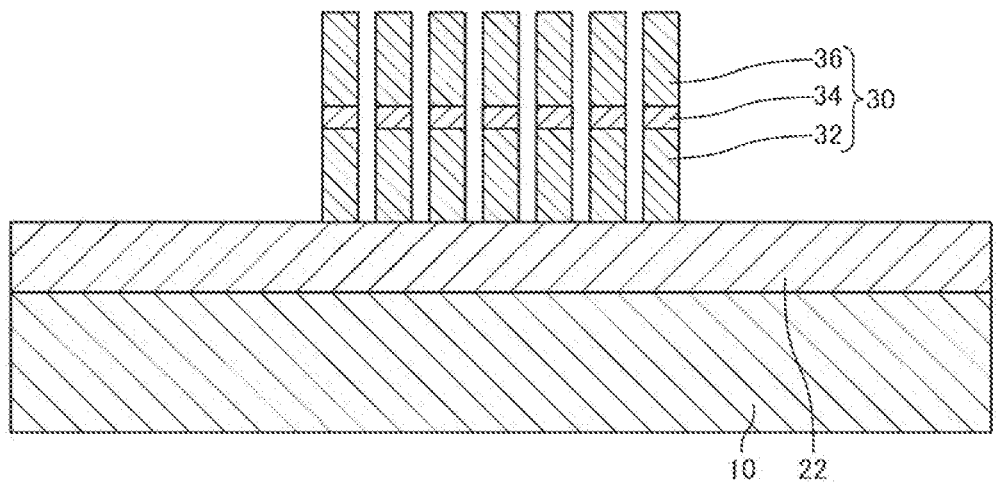
FIG. 3 is a cross-sectional view schematically showing a manufacturing process of the light emitting device according to the first embodiment.
Figure 4:
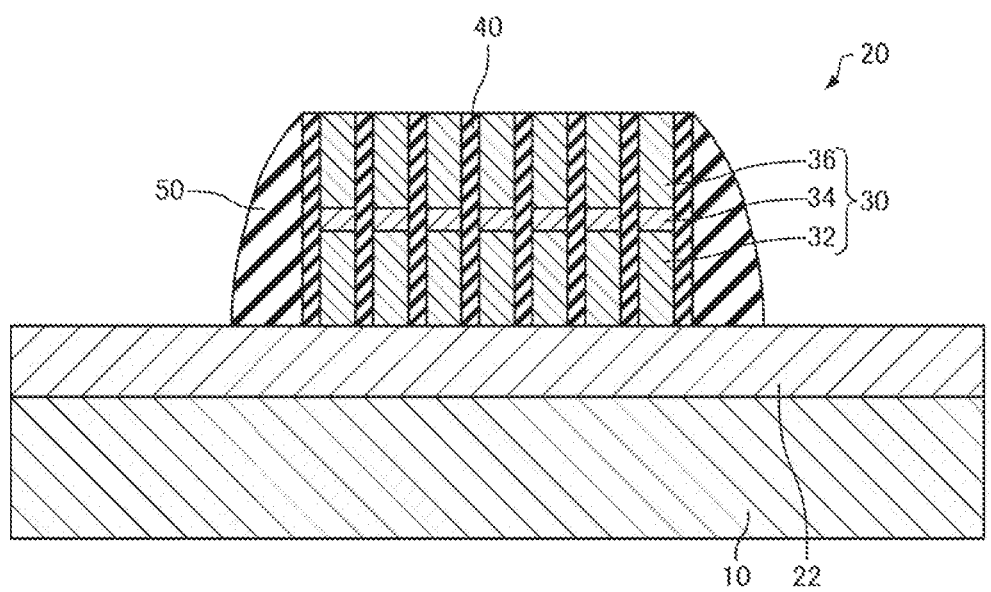
FIG. 4 is a cross-sectional view schematically showing the manufacturing process of the light emitting device according to the first embodiment.

FIG. 3 and FIG. 4 are cross-sectional views schematically showing the manufacturing process of the light emitting device 100.

As shown in FIG. 3, the buffer layer 22 is grown epitaxially on the substrate 10. As the method of achieving the epitaxial growth, there can be cited, for example, an MOCVD (Metal Organic Chemical Vapor Deposition) method and an MBE (Molecular Beam Epitaxy) method.

Then, the plurality of columnar parts 30 is formed on the buffer layer 22. For example, firstly, a mask layer not shown is formed on the buffer layer 22, then the first semiconductor layer 32, the light emitting layer 34, and the second semiconductor layer 36 are grown epitaxially on the buffer layer 22 using the mask layer as a mask. As the method of achieving the epitaxial growth, there can be cited, for example, the MOCVD method and the MBE method. Due to the present process, it is possible to form the columnar parts 30.

As shown in FIG. 4, the light propagation layer 40 is formed between the columnar parts 30 adjacent to each other. The light propagation layer 40 is formed using, for example, the MOCVD method or a spin-coating method. Due to the process described hereinabove, the laminated structure 20 can be formed. Then, the sidewall 50 is formed on the side wall of the light propagation layer 40. The sidewall 50 can be formed by, for example, depositing a silicon oxide layer on the entire surface, and then performing an etch back.

As shown in FIG. 1, the insulating layer 60 covering the laminated structure 20 is formed. The insulating layer 60 is formed by deposition using, for example, a spin-coating method or a CVD method, and patterning. Then, the first electrode 70 is formed on the buffer layer 22, and the second electrode 72 having the holes 4 is formed on the laminated structure 20. The first electrode 70 and the second electrode 72 are formed by deposition using, for example, a sputtering method or a vacuum deposition method, and patterning. Due to the above process, the covering part 2 is formed.

Due to the process described hereinabove, it is possible to manufacture the light emitting device 100.

2. Second Embodiment

Figure 5:
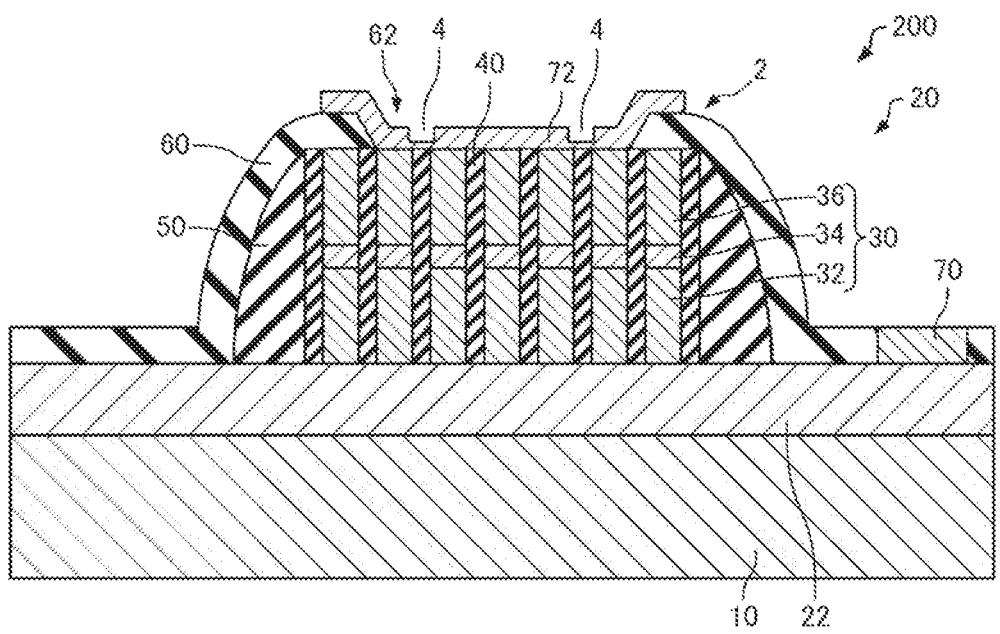
FIG. 5 is a cross-sectional view schematically showing a light emitting device according to a second embodiment.

Then, a light emitting device according to a second embodiment will be described with reference to the drawings. FIG. 5 is a cross-sectional view schematically showing a light emitting device 200 according to the second embodiment. Hereinafter, in the light emitting device 200 according to the second embodiment, the members having substantially the same functions as those of the constituent members of the light emitting device 100 according to the first embodiment described above will be denoted by the same reference symbols, and the detailed descriptions thereof will be omitted.

As shown in FIG. 1, in the light emitting device 100 described above, the holes 4 are each a through hole penetrating the second electrode 72. In contrast, in the light emitting device 200, the holes 4 do not penetrate the second electrode 72 as shown in FIG. 5. In other words, the holes 4 are each a bottomed hole. The depth of the holes 4 is not particularly limited.

In the light emitting device 200, the holes 4 do not penetrate the second electrode 72. Even when the holes do not penetrate the second electrode 72, the part absorbing the light decreases accordingly to the holes 4 in the second electrode 72, and therefore, it is possible to reduce the light absorption. Therefore, in the light emitting device 200, the oscillation threshold value can be decreased.

A method of manufacturing the light emitting device 200 is substantially the same as the method of manufacturing the light emitting device 100 except the point that the holes 4 are prevented from penetrating in the process of forming the second electrode 72, and therefore, the description thereof will be omitted.

3. Third Embodiment

Figure 6:
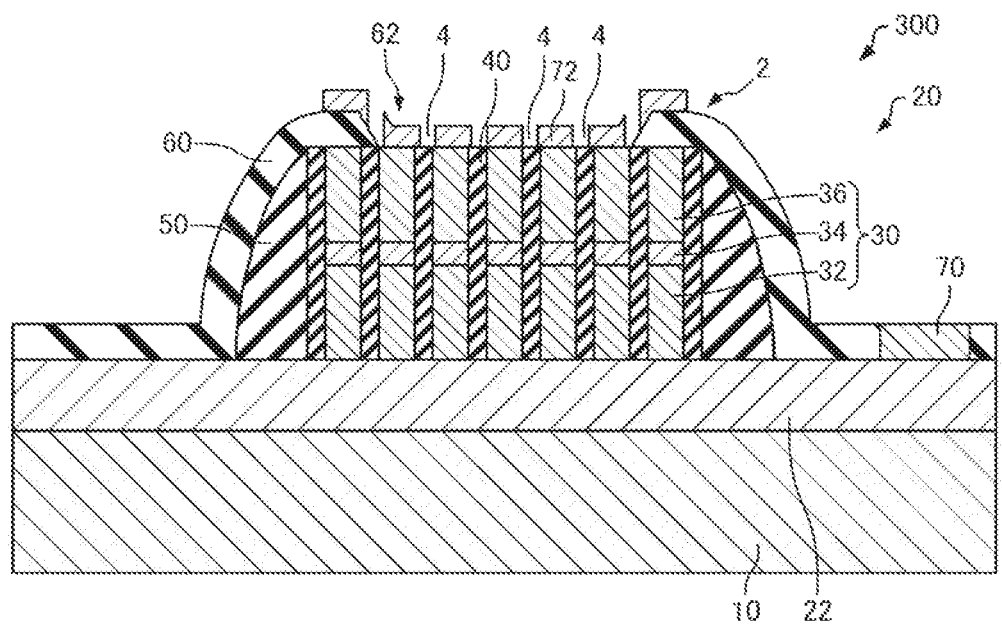
FIG. 6 is a cross-sectional view schematically showing a light emitting device according to a third embodiment.
Figure 7:
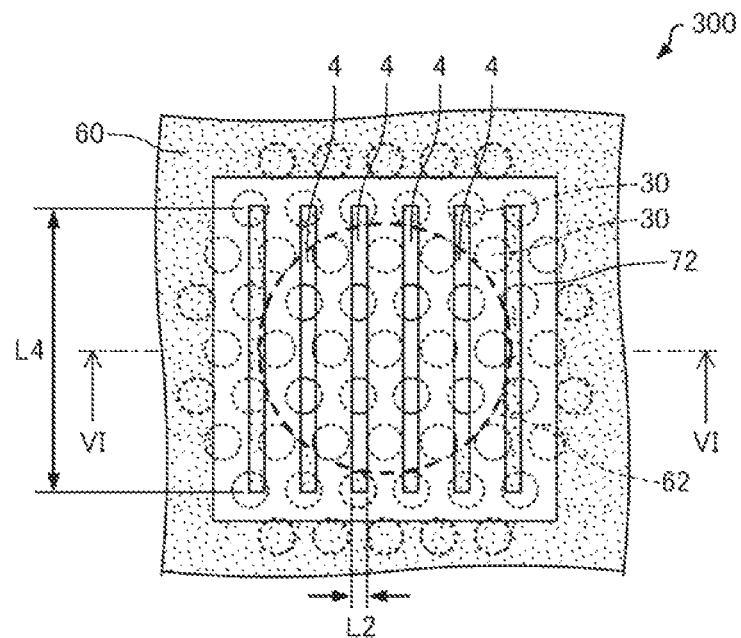
FIG. 7 is a plan view schematically showing the light emitting device according to the third embodiment.

Then, a light emitting device according to a third embodiment will be described with reference to the drawings. FIG. 6 is a cross-sectional view schematically showing a light emitting device 300 according to the third embodiment. FIG. 7 is a plan view schematically showing the light emitting device 300 according to the third embodiment. It should be noted that FIG. 6 is a cross-sectional view along the line VI-VI shown in FIG. 7. Hereinafter, in the light emitting device 300 according to the third embodiment, the members having substantially the same functions as those of the constituent members of the light emitting device 100 according to the first embodiment described above will be denoted by the same reference symbols, and the detailed description thereof will be omitted.

As shown in FIG. 6 and FIG. 7, in the light emitting device 300, the holes 4 are each disposed so as to have a slit-like shape.

As shown in FIG. 7, the holes 4 each have a longitudinal direction and a short-side direction in the plan view. In the example shown in FIG. 7, the planar shape of each of the holes 4 is a rectangular shape. It should be noted that the planar shape of each of the holes 4 is not particularly limited as long as the shape has a longitudinal direction and a short-side direction, and can also be, for example, an ellipse.

The length L2 in the short-side direction of the hole 4 is shorter than the diametrical size of the columnar part 30. Therefore, the holes 4 do not hinder the electrical coupling between the second electrode 72 and the columnar parts 30. For example, when the length L2 of the hole 4 is no shorter than the diametrical size of the columnar part 30, the second electrode 72 and the columnar part 30 fail to electrically be coupled to each other in some cases depending on the position of the hole 4. In contrast, when the length L2 of the hole 4 is shorter than the diametrical size of the columnar part 30, it is possible to surely couple the second electrode 72 and the columnar part 30 electrically to each other irrespective of the position of the hole 4.

The length L4 in the longitudinal direction of the hole 4 is longer than, for example, the diametrical size of the columnar part 30. In the example shown in FIG. 8, the length L4 of the hole 4 is longer than the width of the opening part 62 of the insulating layer 60.

In the light emitting device 300, since the second electrode 72 is provided with the holes 4, substantially the same functions and advantages as those of the light emitting device 100 can be exerted.

It should be noted that although the holes 4 are each a through hole penetrating the second electrode 72 in the above description as shown in FIG. 6, the holes 4 are not required to penetrate the second electrode 72 although not shown in the drawings.

A method of manufacturing the light emitting device 300 is substantially the same as the method of manufacturing the light emitting device 100 except the point that the holes 4 are each formed to have a slit-like shape in the process of forming the second electrode 72, and therefore, the description thereof will be omitted.

4. Fourth Embodiment

Figure 8:
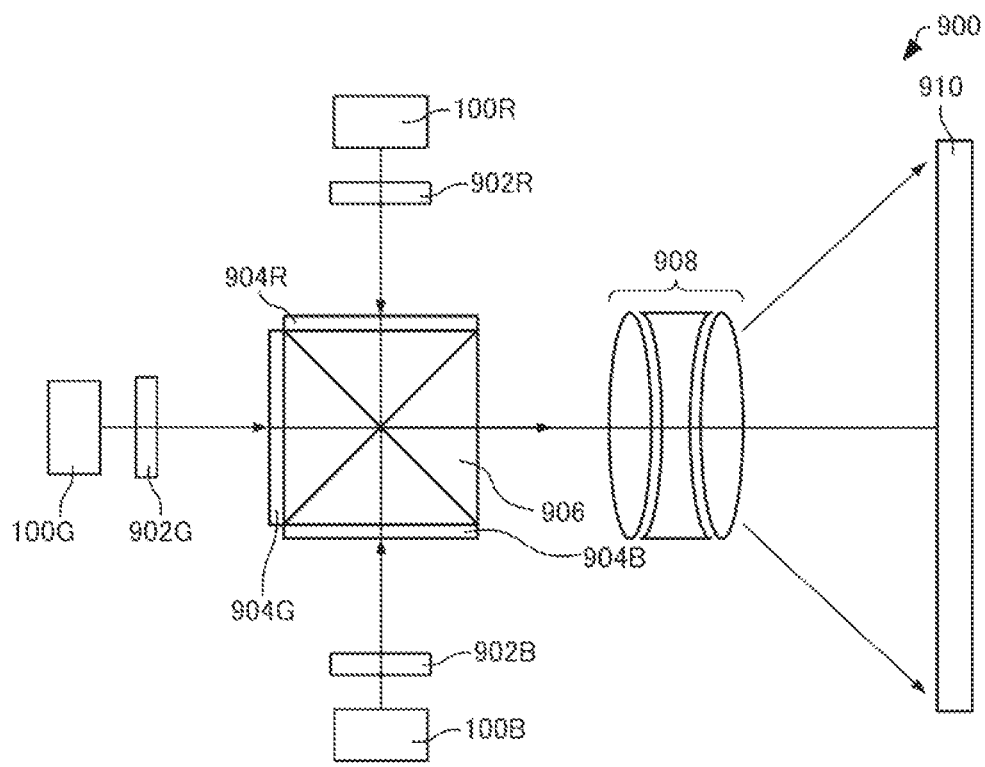
FIG. 8 is a diagram schematically showing a projector according to a fourth embodiment.

Then, a projector according to a fourth embodiment will be described with reference to the drawings. FIG. 8 is a diagram schematically showing a projector 900 according to the fourth embodiment.

The projector 900 has, for example, the light emitting device 100 as a light source.

The projector 900 includes a housing not shown, a red light source 100R, a green light source 100G, and a blue light source 100B which are disposed inside the housing, and respectively emit red light, green light, and blue light. It should be noted that in FIG. 8, the red light source 100R, the green light source 100G, and the blue light source 100B are simplified for the sake of convenience.

The projector 900 further includes a first optical element 902R, a second optical element 902G, a third optical element 902B, a first light modulation device 904R, a second light modulation device 904G, a third light modulation device 904B, and a projection device 908 all installed inside the housing. The first light modulation device 904R, the second light modulation device 904G, and the third light modulation device 904B are each, for example, a transmissive liquid crystal light valve. The projection device 908 is, for example, a projection lens.

The light emitted from the red light source 100R enters the first optical element 902R. The light emitted from the red light source 100R is collected by the first optical element 902R. It should be noted that the first optical element 902R can be provided with other functions than the light collection. The same applies to the second optical element 902G and the third optical element 902B described later.

The light collected by the first optical element 902R enters the first light modulation device 904R. The first light modulation device 904R modulates the incident light in accordance with image information. Then, the projection device 908 projects an image formed by the first light modulation device 904R on a screen 910 in an enlarged manner.

The light emitted from the green light source 100G enters the second optical element 902G. The light emitted from the green light source 100G is collected by the second optical element 902G.

The light collected by the second optical element 902G enters the second light modulation device 904G. The second light modulation device 904G modulates the incident light in accordance with the image information. Then, the projection device 908 projects an image formed by the second light modulation device 904G on the screen 910 in an enlarged manner.

The light emitted from the blue light source 100B enters the third optical element 902B. The light emitted from the blue light source 100B is collected by the third optical element 902B.

The light collected by the third optical element 902B enters the third light modulation device 904B. The third light modulation device 904B modulates the incident light in accordance with the image information. Then, the projection device 908 projects an image formed by the third light modulation device 904B on the screen 910 in an enlarged manner.

Further, it is possible for the projector 900 to include a cross dichroic prism 906 for combining the light emitted from the first light modulation device 904R, the light emitted from the second light modulation device 904G, and the light emitted from the third light modulation device 904B with each other to guide the light thus combined to the projection device 908.

The three colors of light respectively modulated by the first light modulation device 904R, the second light modulation device 904G, and the third light modulation device 904B enter the cross dichroic prism 906. The cross dichroic prism 906 is formed by bonding four rectangular prisms to each other, and is provided with a dielectric multilayer film for reflecting the red light and a dielectric multilayer film for reflecting the blue light disposed on the inside surfaces. The three colors of light are combined with each other by these dielectric multilayer films, and thus, the light representing a color image is formed. Then, the light thus combined is projected on the screen 910 by the projection device 908, and thus, an enlarged image is displayed.

It should be noted that it is possible for the red light source 100R, the green light source 100G, and the blue light source 100B to directly form the images by controlling the light emitting devices 100 as the pixels of the image in accordance with the image information without using the first light modulation device 904R, the second light modulation device 904G, and the third light modulation device 904B. Then, it is also possible for the projection device 908 to project the images formed by the red light source 100R, the green light source 100G, and the blue light source 100B on the screen 910 in an enlarged manner.

Further, although the transmissive liquid crystal light valves are used as the light modulation devices in the example described above, it is also possible to use light valves other than the liquid crystal light valves, or to use reflective light valves. As such light valves, there can be cited, for example, reflective liquid crystal light valves and Digital Micromirror Device™. Further, the configuration of the projection device is appropriately modified in accordance with the type of the light valves used.

Further, it is also possible to apply the light source to a light source device of a scanning type image display device having a scanning unit as an image forming device for scanning the surface of the screen with the light from the light source to thereby display an image with a desired size on the display surface.

The light emitting devices according to the embodiments described above can also be used for other devices than projectors. As the applications other than projectors, there can be cited, for example, a light source of indoor and outdoor illumination, a backlight for a display, a laser printer, a scanner, an in-car light, sensing equipment using light, communication equipment, and so on.

5. Other Issues

It should be noted that the present disclosure is not limited to the embodiments described above, but can be put into practice with a variety of modifications within the scope or the spirit of the present disclosure.

For example, although there is described the light emitting layer 34 of the InGaN type in the light emitting device 100 according to the first embodiment described above, as the light emitting layer 34, it is possible to use any types of material capable of emitting light in response to an electrical current injected in accordance with the wavelength of the light to be emitted. It is possible to use semiconductor materials such as an AlGaN type, an AlGaAs type, an InGaAs type, an InGaAsP type, an InP type, a GaP type, or an AlGaP type. The same applies to the light emitting devices according to the second through third embodiments, and as the light emitting layer 34, it is possible to use a variety of material types in accordance with the wavelength of the light emitted.

In the present disclosure, some of the constituents can be omitted, or the embodiments and the modified examples can be combined with each other within a range in which the features and the advantages described in the specification are provided.

The present disclosure is not limited to the embodiments described above, but can further variously be modified. For example, the present disclosure includes substantially the same configuration as the configurations described in the embodiments. Substantially the same configuration means a configuration substantially the same in, for example, function, way, and result, or a configuration substantially the same in object and advantage. Further, the present disclosure includes configurations obtained by replacing a non-essential part of the configuration explained in the above description of the embodiments. Further, the present disclosure includes configurations providing the same functions and the same advantages, or configurations capable of achieving the same object as the configuration explained in the description of the embodiments. Further, the present disclosure includes configurations obtained by adding a known technology to the configuration explained in the description of the embodiments.

What is claimed is:

1. A light emitting device comprising:
a substrate;
a laminated structure provided to the substrate, the laminated structure including a plurality of columnar parts; and
an electrode disposed at an opposite side to the substrate of the laminated structure, wherein
each of the plurality of columnar parts has a light emitting layer,
the plurality of columnar parts are disposed between the electrode and the substrate,
light generated in the light emitting layers propagates through the plurality of columnar parts to cause laser oscillation,
the electrode is provided with a plurality of holes, and
a number of the plurality of columnar parts that overlap the plurality of holes in a plan view is less than a number of the plurality of columnar parts that do not overlap the plurality of holes in the plan view.

2. The light emitting device according to claim 1, wherein the plurality of holes penetrate the electrode.

3. The light emitting device according to claim 2, wherein a diametrical size of the hole is smaller than a diametrical size of each of the plurality of columnar parts.

4. The light emitting device according to claim 1, wherein a distance between adjacent two holes of the plurality of holes is longer than a wavelength of the light generated by the light emitting layers.

5. A projector comprising:
the light emitting device according to claim 1.

* * * * *